(12) United States Patent
Iwasaki et al.

(10) Patent No.: US 7,061,164 B2
(45) Date of Patent: Jun. 13, 2006

(54) CRYSTAL OSCILLATOR

(75) Inventors: Takahiko Iwasaki, Saitama (JP); Shigeru Obara, Saitama (JP); Genwa Koki, Saitama (JP); Masaaki Nakahara, Saitama (JP)

(73) Assignee: Nihon Dempa Kogyo Co., Ltd., Saitama (JP)

( * ) Notice: Subject to any disclaimer, the term of this patent is extended or adjusted under 35 U.S.C. 154(b) by 0 days.

(21) Appl. No.: 11/142,100

(22) Filed: Jun. 1, 2005

(65) Prior Publication Data

US 2005/0269912 A1 Dec. 8, 2005

(30) Foreign Application Priority Data

Jun. 3, 2004 (JP) .............................. 2004-165232

(51) Int. Cl.
*H03H 9/17* (2006.01)
*H03H 9/19* (2006.01)
*H01L 41/047* (2006.01)

(52) U.S. Cl. ...................... 310/364; 310/366; 310/363; 310/365

(58) Field of Classification Search ......... 310/363–366
See application file for complete search history.

(56) References Cited

FOREIGN PATENT DOCUMENTS

JP 2003-332876 11/2003
JP 2004200835 A * 7/2004

* cited by examiner

*Primary Examiner*—Karl Tamai
*Assistant Examiner*—J. Aguirrechea
(74) *Attorney, Agent, or Firm*—Scott D. Wofsy; Edwards Angell Palmer & Dodge LLP

(57) ABSTRACT

The present invention relates to a crystal oscillator that is provided with a crystal element; a main surface electrode configured of a first underlayer formed on each of two main surfaces of the crystal element and a first surface layer of Au superimposed over the first underlayer; an end surface electrode having a second underlayer formed on the crystal element to extend over the main surface electrode and a second surface layer of Au superimposed to cover the second underlayer; a supporter for holding the crystal element in the horizontal direction, bonded to the end surface electrode by a eutectic alloy comprising at least Au; and a base on which the supporter stands. An intermediate layer is provided between the second underlayer and the second surface layer of the end surface electrode; the intermediate layer protrudes further towards the center over the main surface electrode than the second surface layer; and also the intermediate layer is formed of a metal having the characteristic of increasing the adhesive strength between the underlayer and the second surface layer as well as that of the eutectic alloy. The present invention provides a crystal oscillator in which bonding is done with a eutectic alloy that has a higher bond strength, thus preventing peeling of the electrodes.

10 Claims, 3 Drawing Sheets

CRYSTAL OSCILLATOR

BACKGROUND OF THE INVENTION

1. Field of the Invention

The present invention relates to a crystal oscillator and, in particular, to a crystal oscillator that holds a crystal element by using a eutectic alloy.

2. Description of Related Art

A crystal oscillator is known as a frequency control element, and is used as an oscillation generator in an oscillator of a communications device, by way of example. In one type of this crystal oscillator is a crystal oscillator for high stability use wherein a eutectic alloy is used to hold a crystal element that is sealed and enclosed within a metal container.

FIG. 3 is illustrative of an example of a prior-art crystal oscillator, with FIG. 3A being a longitudinal section therethrough, FIG. 3B being a plan view of essential components thereof, and FIG. 3C being a partial expanded longitudinal section therethrough.

As shown in FIG. 3, this crystal oscillator is provided with a metal base 1, supporters 2, a crystal element 3, and a metal cover 4. The metal base 1 has a flange 1b around the outer periphery and at least a pair of sealed terminals 5 pass through the main body of the metal base 1. In this case, two pairs (a total of four) of the sealed terminals 5 pass through the metal base 1. A lead wire of each of the sealed terminals 5 protrudes on one main surface side of the crystal element 3 and is led out to the other main surface thereof. The sealed terminals 5 are positioned on straight lines that mutually cross in concentric circles.

Each supporter 2 is formed of a metal such as nickel (Ni) and is a flat plate of a substantially L-shaped section. The leading end of one of the sealed terminals (lead wires) 5 that protrudes towards one main surface of the base 1 is welded by a laser to the horizontal portion of the L-shape thereof. In this case, the L-shaped horizontal portion extends towards the center and the flat surface of the perpendicular portion thereof faces the crystal element 3.

The crystal element 3 is an SC-cut or AT-cut crystal, of a circular shape as shown in FIG. 3B. This type of crystal oscillator has a main surface electrode 6 provided on each of the two main surfaces of the crystal element 3 and an end surface electrode 7 that is formed to extend between the two main surfaces. The main surface electrodes 6 have excitation (base) electrodes 6a that face each other in mutually opposite directions on the two main surfaces and extraction electrodes 6b that extend from each excitation electrode 6a on opposite sides in mutually opposite directions. The excitation electrodes 6a and extraction electrodes 6b are formed by deposition on the two main surfaces of the crystal element 3. A first underlayer 8a formed of a material such as chrome (Cr) is disposed on one main surface of the crystal element 3, and a first surface layer 9a of gold (of Au) is superimposed on the first underlayer 8a, as shown in FIG. 3C.

The end surface electrodes 7 are formed as one pair of end portions A and A' on the crystal element 3 extending from the extraction electrodes 6b, as shown in FIG. 3B, and another pair of end portions B and B' perpendicular thereto. Each of these end surface electrodes 7 is formed of a nickel-chrome (of NiCr) alloy and is shaped to extend between the two main surfaces of the crystal element 3. Note that each end surface electrode 7 that extends between the main surfaces is formed so that the end portions A and A' are superimposed on the extraction electrodes 6b whereas the other two end portions B and B' are formed directly on the crystal element 3.

A eutectic alloy 10 formed of a gold-germanium (of AuGe) alloy is interposed between a side surface of each of the two end portions A and A' and the other two end portions B and B' of the crystal element 3 and the vertical surface of the corresponding supporter 2, as shown in FIG. 3C. The eutectic alloy 10 could be fixed to the vertical surface of the supporter 2 by being melted, by way of example. The side surfaces of the crystal element 3 are abutted against the four supporters 2 by means of a jig or the like, and the assembly is heated to approximately 400° C. This causes the eutectic alloy 10 to melt, enabling bonding of the end surfaces, including the main surfaces of the crystal element 3, to the supporters 2 and thus holding the crystal element 3 horizontally above the metal base 1.

The metal cover 4 is subsequently bonded to the metal base 1 by a method such as cold welding, to seal and enclose the crystal element 3 within the metal cover 4.

In the thus-configured crystal oscillator, the crystal element 3 can be bonded to the supporter 2 by the eutectic alloy 10 without having to use materials such as an electrically conductive adhesive, to obtain favorable oscillation characteristics without generating organic gases. It can therefore be applied to a crystal oscillator for high-stability use.

The end surface electrodes 7 are configured to NiCr and are superimposed over the extraction electrodes 6b of the main surface electrodes 6, made of Au. Thus when the eutectic alloy 10 is melted, the gold (of Au) of the main surface electrode 6 is absorbed by the diffusion of the eutectic alloy 10 and the NiCr, to prevent the phenomenon known as gold corrosion. If only the end surface of the end surface electrode 7 made of NiCr were superimposed over the extraction electrode 6b of the main surface electrode 6, the eutectic alloy 10 would flow over the main surface electrode 6 (of Au) and induce the gold corrosion phenomenon. As a result, the main surface electrode 6 (of Au) will peel off from the crystal element 3, which will cause conductivity failures (refer to Japanese Patent Laid-Open Publication No. 2003-332876).

In addition, since the end surface electrodes 7 of the prior-art crystal oscillator of the above configuration is formed only of NiCr, the adhesive strength thereof with the eutectic alloy 10 is weak, leading to a problem concerning low bond strength. An impact or the like could cause the crystal element 3 to separate from the supporters 2, which would cause a deterioration in shock resistance.

For that reason, the end surface electrode 7 of NiCr of the prior-art crystal oscillator has a configuration such that a second surface layer 9b formed of Au is superimposed on a second underlayer 8b formed of NiCr, as shown in FIG. 4. It should be noted that the second underlayer 8b (of NiCr) protrudes further towards the center on the main surface of the crystal element 3 than the second surface layer 9b (of Au). However, similar gold corrosion of the second surface layer 9b (of Au) can occur in this case, due to the eutectic alloy 10 (of AuGe), so that the bond strength with the second underlayer 8b (of NiCr) becomes weaker, which causes problems concerning unexpected peeling from the crystal element 3.

The present invention has the objective of providing a crystal oscillator in which this peeling is prevented and the bond strength is increased by bonding with a eutectic alloy.

SUMMARY OF THE INVENTION

The present invention relates to a crystal oscillator that is provided with a crystal element; a first underlayer formed on each of two main surfaces of the crystal element; a main surface electrode formed of a first surface layer of Au formed over each of those first underlayers; an end surface electrode having a second underlayer formed on a side surface of the crystal element to extend between the main surface electrodes and a second surface layer of Au; a flat-plate shaped supported bonded to each end surface electrode by a eutectic allow comprising Au, to hold the crystal element in the horizontal direction; and a base on which the supporter stands. An intermediate layer is provided between the second underlayer and the second surface layer of the end surface electrode; the intermediate layer protrudes further towards the center over the main surface electrode than the second surface layer; and also the intermediate layer is formed of a metal that increases the adhesive strength between the underlayer and the second surface layer, and also of the eutectic alloy.

This configuration ensures that the second surface layer of the end surface electrode is formed of Au, enabling an increase in the bond strength due to the affinity with the eutectic alloy that comprises Au. Since the intermediate layer that increases the adhesive strength between the second surface layer and the eutectic layer is interposed between the second underlayer and the second surface layer of the end surface electrode, the bond strength with the intermediate layer is increased even if gold corrosion occurs in the second surface layer (of Au), thus making it possible to prevent peeling.

Since the intermediate layer protrudes further towards the center over the main surface of the crystal element than the second surface layer, the eutectic alloy is prevented from flowing as far as the first surface layer (of Au), thus preventing gold corrosion. The bond strength can therefore be increased overall by the use of the eutectic alloy, preventing gold corrosion of the main surface and enabling a reliable bond between the supporter and the crystal element.

In accordance with the present invention, the underlayer is configured of Cr or NiCr and the intermediate layer is configured of platinum (Pt) or titanium (Ti). This creates a favorable affinity with the Cr or NiCr of the underlayer, increasing the adhesion strength with respect to the crystal element. Since the Pt or Ti of the intermediate layer has a good affinity for the underlayer (of Cr or NiCr) and the second surface layer (of Au) as well as the eutectic alloy comprising Au, the adhesive strength of both can be further increased.

BRIEF DESCRIPTION OF THE DRAWINGS

FIG. 3 is illustrative of a prior-art example of a crystal oscillator, where

DETAILED DESCRIPTION OF PREFERRED EMBODIMENT

Embodying Example

Figure 1:
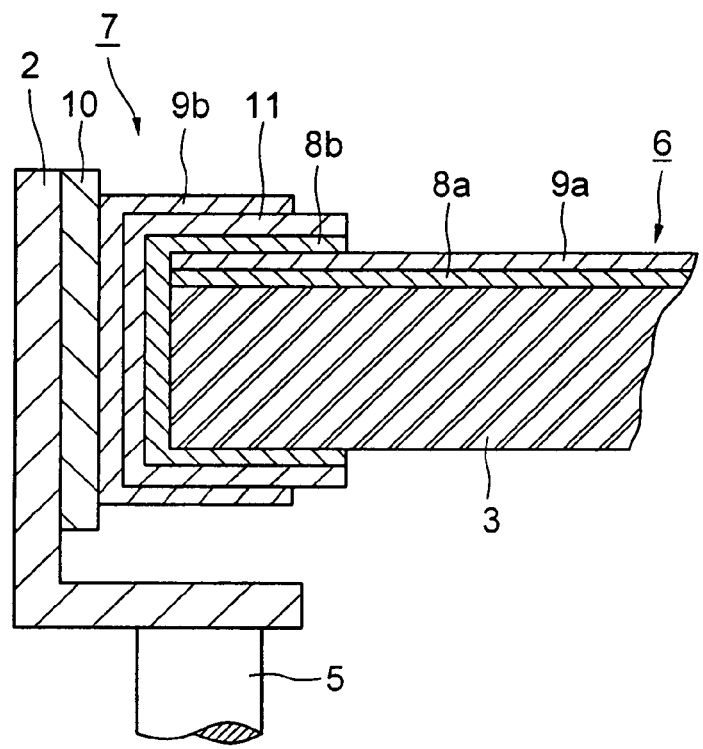
FIG. 1 is an enlarged partial longitudinal section that illustrates an embodying example of the crystal oscillator in accordance with the present invention.
Figure 2:
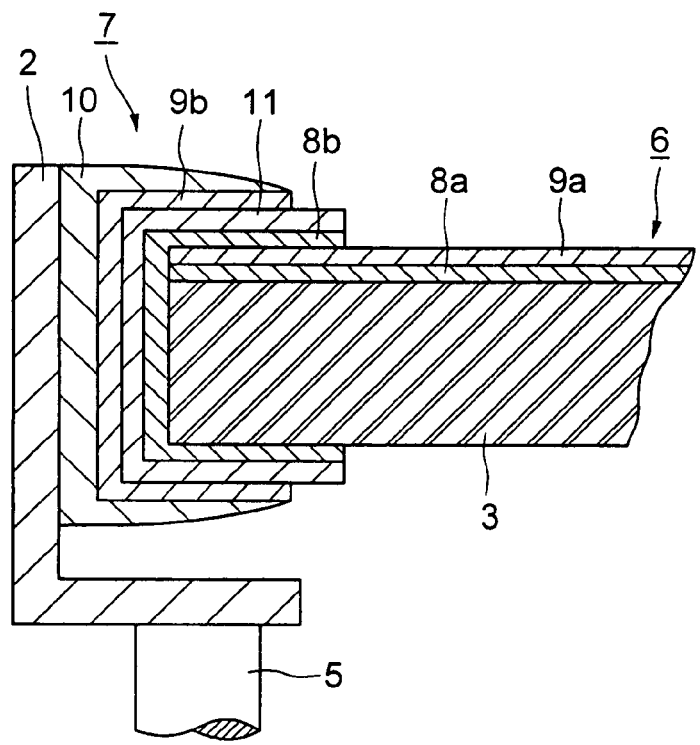
FIG. 2 is an enlarged partial longitudinal section that illustrates how the melted eutectic metal is prevented from flowing during the fabrication of the crystal oscillator of the present invention.

An embodying example of a crystal oscillator in accordance with the present invention is shown in FIGS. 1 and 2, where FIG. 1 is a partial expanded longitudinal section through the crystal oscillator of the present invention and FIG. 2 is a partial expanded longitudinal section that illustrates how melted eutectic metal is prevented from flowing.

Figure 3A:
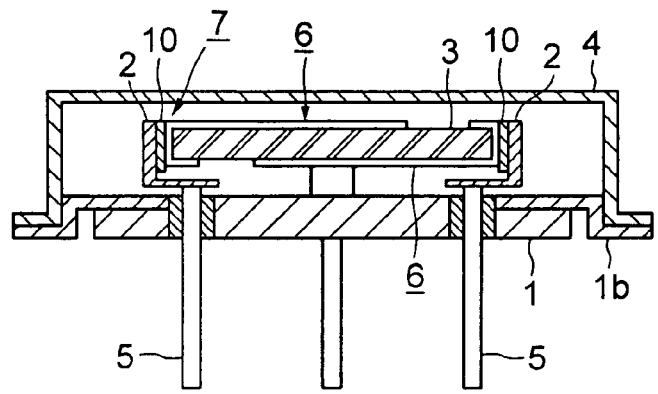
FIG. 3A is a longitudinal section therethrough.
Figure 3B:
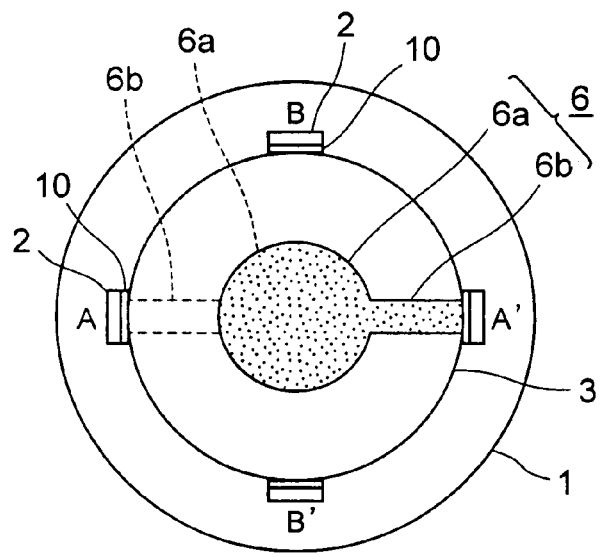
FIG. 3B is a plan view of essential components thereof.
Figure 3C:
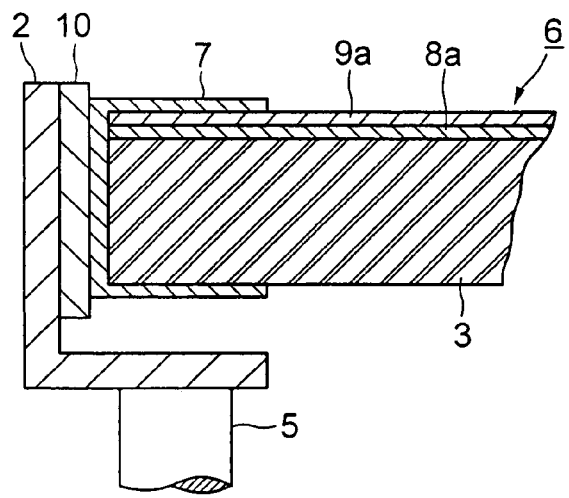
FIG. 3C is an enlarged partial longitudinal section thereof.
Figure 4:
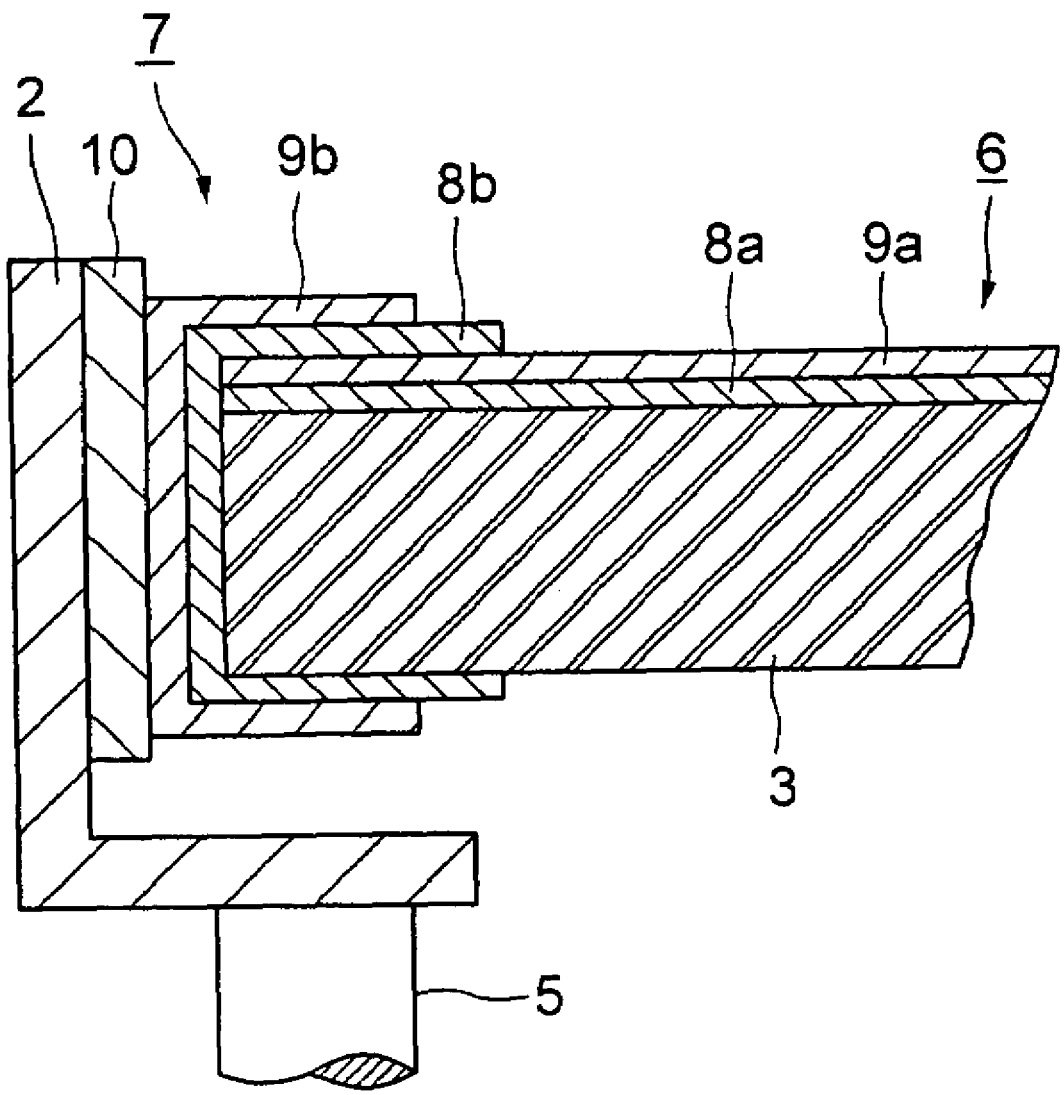
FIG. 4 is a partial expanded longitudinal section that illustrates another example of the prior-art crystal oscillator.

In the crystal oscillator of the present invention the substantially C-shaped end surface electrodes 7, which are provided at the two end portions A and A' and the other two end portions B and B' of the crystal element 3 having the main surface electrodes 6, are bonded to the L-shaped supporters 2 (such as four supporters) by the eutectic alloy 10 (of an AuGe alloy), as shown in FIG. 1, to hold the crystal element 3 horizontally above the metal base 1 (see FIG. 3A). The main surface electrode 6 is configured of the first underlayer 8a of Cr and the first surface layer 9a of Au superimposed thereon. Each end surface electrode 7 is configured of the second underlayer 8b of NiCr and the second surface layer 9b of Au.

In this case, an intermediate layer 11 formed of Pt is provided between the second underlayer 8b (of NiCr alloy) and the second surface layer 9b (of Au) of each end surface electrode 7. The intermediate layer 11 (of Pt) protrudes towards the center more than the second surface layer 9b (of Au) at each of the two end portions A and A', and is formed to be the same length as the second surface layer 9b at the other two end portions B and B'. The eutectic alloy 10 (of AuGe alloy) melts and fills the spaces between each end surface electrode 7 and the corresponding supporter 2, and bonds the two end portions A and A' and the other two end portions B and B' of the crystal element 3 to the supporters 2 on solidification.

This configuration ensures that the mutual bond strength is increased by the metallic affinity between the Au of the second surface layer 9b of the end surface electrode 7 and the eutectic alloy 10 formed of AuGe. The intermediate layer 11 (of Pt) of each end surface electrode 7 provides a large adhesive strength between the second underlayer 8b (of NiCr) and the second surface layer 9b (of Au), and also with the eutectic alloy 10. Peeling can therefore be prevented before it happens since the bond strength of the eutectic alloy 10 (of AuGe) and between the second surface layer 9b (of Au) and the intermediate layer 11 (of Pt) is increased, even if gold corrosion should occur between the second surface layer 9b (of Au) and the eutectic alloy 10 (of AuGe).

As shown in FIG. 1, since the intermediate layer 11 (of Pt) protrudes further towards the center over the main surface of the crystal element 3 than the second surface layer 9b (of Au), the eutectic alloy 10 (of AuGe) can be prevented from flowing as far as the first surface layer 9a (of Au) of the main surface electrode 6 when melted, even if the eutectic alloy 10 (of AuGe) flows over the second surface layer 9b (of Au), as shown in FIG. 2.

It is, therefore, possible to prevent gold corrosion of the first surface layer 9a (of Au) caused by the eutectic alloy 10 (of AuGe) and the second underlayer 8b (of NiCr). This enables an increase in the eutectic alloy 10 (of AuGe) overall, and also enables a reliable bond between each supporter 2 and the crystal element 3, without peeling from the crystal element 3 due to gold corrosion of the main surface electrodes 6.

In the above-described crystal oscillator of the present invention, the intermediate layer 11 of the end surface electrode 7 is configured of Pt, but it could be another metal such as Ti in other embodying examples. The basic idea is to use a metal that can increase the adhesive strength between the second underlayer 8b and the second surface layer 9b, and also of the eutectic alloy 10. Since the first under electrode 8a of the main surface electrode 6 is of Cr, the second underlayer of the end surface electrode 7 is configured of NiCr, but the usage of Cr and NiCr can be reversed.

In the crystal oscillator of the present invention, the end surface electrodes 7 were described as being provided at two end portions and another two end portions, but the configuration could also be such that the end surface electrodes 7 are provided at two end portions extending from the extraction electrodes 6b of the main surface electrodes 6, and only those two end portions are held. The crystal element 3 was described above as being circular, but it could equally well be square. In addition, the eutectic alloy 10 was described as being an AuGe alloy, but it could also be a gold-tin (AuSn) allow, by way of example. Basically, the eutectic alloy 10 is an eutectic alloy such that the temperature of melting of the components thereof, including Au, are less than the transition point temperature 573° C. of the crystal.

What is claimed is:

1. In a crystal oscillator provided with a crystal element; a main surface electrode configured of a first underlayer formed on each of two main surfaces of said crystal element and a first surface layer of Au superimposed over said first underlayer; an end surface electrode having a second underlayer formed on said crystal element to extend over said main surface electrode and a second surface layer of Au superimposed to cover said second underlayer; a supporter for holding said crystal element in the horizontal direction, bonded to said end surface electrode by a eutectic alloy comprising at least Au; and a base on which said supporter stands, a crystal oscillator wherein an intermediate layer is provided between said second underlayer and said second surface layer of said end surface electrode; said intermediate layer protrudes further towards the center over said main surface electrode than said second surface layer; and also said intermediate layer is formed of a metal having the characteristic of increasing the adhesive strength between said underlayer and said second surface layer, as well as that of said eutectic alloy.

2. The crystal oscillator as defined by claim 1, wherein said first underlayer is formed of Cr.

3. The crystal oscillator as defined by claim 1, wherein said second underlayer is formed of a NiCr alloy.

4. The crystal oscillator as defined by claim 1, wherein said intermediate layer is formed of Pt or Ti.

5. The crystal oscillator as defined by claim 1, wherein said first surface layer is formed of Au.

6. The crystal oscillator as defined by claim 1, wherein said second surface layer is formed of Au.

7. The crystal oscillator as defined by claim 1, wherein said eutectic alloy is an AuGe alloy or an AuSn alloy.

8. The crystal oscillator as defined by claim 1, wherein said eutectic alloy is an eutectic alloy having a melting temperature that is less than the transition point temperature 573° C. of the crystal.

9. The crystal oscillator as defined by claim 1, wherein said end surface electrode is provided at each of two end portions of said crystal element and at two other end portions orthogonal thereto.

10. The crystal oscillator as defined by claim 1, wherein said end surface electrode is provided at each of only two end portions of said crystal element.

* * * * *